(12) United States Patent
Dunlap et al.

(10) Patent No.: US 9,086,432 B1
(45) Date of Patent: Jul. 21, 2015

(54) RAPID CONFIGURATION ADAPTER

(71) Applicant: The Boeing Company, Chicago, IL (US)

(72) Inventors: Bruce William Dunlap, Everett, WA (US); Haldane Lawrence Collins, Everett, WA (US)

(73) Assignee: The Boeing Company, Chicago, IL (US)

( * ) Notice: Subject to any disclaimer, the term of this patent is extended or adjusted under 35 U.S.C. 154(b) by 221 days.

(21) Appl. No.: 13/912,342

(22) Filed: Jun. 7, 2013

(51) Int. Cl.
*G01R 1/04* (2006.01)
*G01R 31/00* (2006.01)

(52) U.S. Cl.
CPC ............ *G01R 1/0441* (2013.01); *G01R 31/001* (2013.01)

(58) Field of Classification Search
CPC ..... G06F 3/0626; G06F 3/0658; G06F 1/183; G01R 1/07328; G01R 1/07378
See application file for complete search history.

(56) References Cited

U.S. PATENT DOCUMENTS

| | | | |
|---|---|---|---|
| 5,404,098 A | 4/1995 | Osburn | |
| 5,585,808 A | 12/1996 | Wysome | |
| 5,589,773 A | 12/1996 | Berger et al. | |
| 5,628,031 A * | 5/1997 | Kikinis et al. | ................... 710/73 |
| 5,825,331 A | 10/1998 | Lee | |
| 6,160,517 A | 12/2000 | Bell et al. | |
| 7,242,359 B2 | 7/2007 | Turner et al. | |
| 7,366,632 B2 | 4/2008 | Hamann et al. | |
| 7,739,073 B2 | 6/2010 | Hamann et al. | |
| 7,756,667 B2 | 7/2010 | Hamann et al. | |
| 7,847,743 B2 | 12/2010 | Yun | |
| 8,358,415 B2 | 1/2013 | Wu et al. | |
| 8,412,111 B2 | 4/2013 | Talwar et al. | |
| 2006/0105597 A1 * | 5/2006 | Purwin | ........................... 439/79 |

* cited by examiner

*Primary Examiner* — Tung X Nguyen

(57) ABSTRACT

The present disclosure is generally directed to a rapid configuration adapter system, method and assembly for testing integrated circuit devices including a test circuit board configured to connect to an integrated circuit test device and an interconnect board configured to receive and electrically connect to the test circuit board. The assembly further includes an interface board configured to connect to an external a controller, processor or data collection equipment, and configured to receive and electrically connect to the interconnect board. The assembly further includes a connections board configured to receive electrical connections thereon and configured to receive and electrically connect to the interface board, the connections board being further configured to accept electrical connections thereupon specific to the test circuit board.

20 Claims, 9 Drawing Sheets

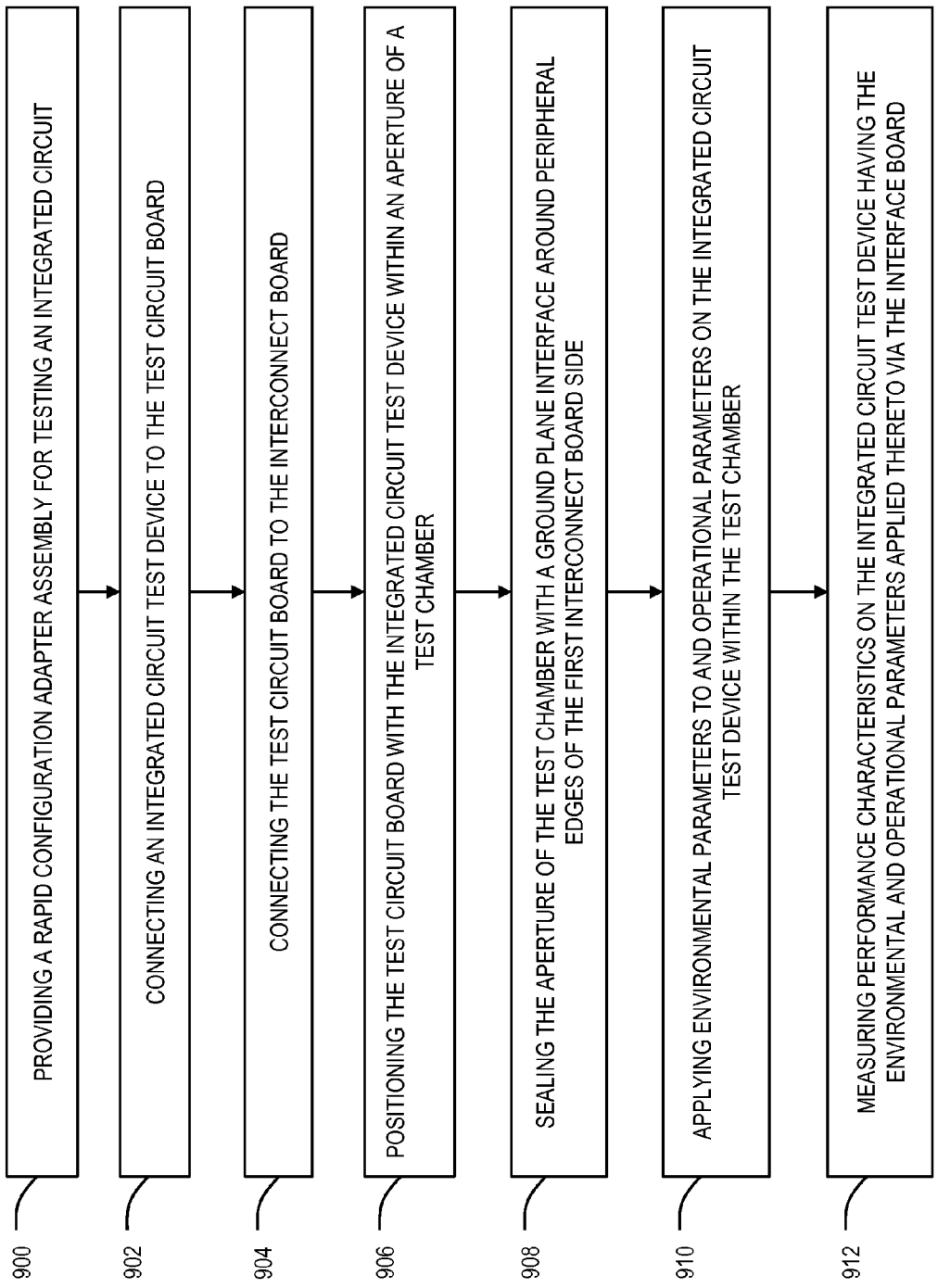

RAPID CONFIGURATION ADAPTER

TECHNICAL FIELD

The field of the embodiments presented herein is directed toward a hardware design that provides a universal hardware interface between a test article and a microprocessor controller, or serial or Universal Serial Bus (USB) interface to a personal computer for controlling and observing the performance of the test article.

BACKGROUND

Finding a cost-effective way to test and certify new replacement parts for obsolete current supplier parts is costly and time-consuming. Replacing obsolete parts is a significant problem throughout many industries, and is especially costly if each part must be retested for certification. The embodiments presented herein provide a means to demonstrate Integrated Circuit (IC) type design for compliance with aviation regulations affecting electrical and electronic systems and sub-systems. There is a need for a single "universal" tool which can be readily configured in response to requirements for characterizing and measuring the Electro Magnetic Compatibility, Noise Immunity Level, and Emissivity of Integrated Circuits using Gigahertz Transverse Electro-Magnetic (GTEM), Transverse Electro-Magnetic (TEM), RF Bulk Current and RF Direct Injection test fixtures. It is with respect to these and other considerations that the disclosure herein is presented.

SUMMARY

It should be appreciated that this Summary is provided to introduce a selection of concepts in a simplified form that are further described below in the Detailed Description. This Summary is not intended to be used to limit the scope of the claimed subject matter.

In one embodiment disclosed herein, a rapid configuration adapter assembly for testing integrated circuit devices includes a test circuit board configured to connect to an integrated circuit test device, and an interconnect board having a first interconnect board side and an oppositely oriented second interconnect board side, the first interconnect board side configured to receive and electrically connect to the test circuit board. The rapid configuration adapter assembly further includes an interface board configured to connect to external one of a controller, a processor or data collection equipment, the interface board having a first interface board side and an oppositely oriented second interface board side, the second interface board side configured to receive and electrically connect to the first interconnect board side. The rapid configuration adapter assembly further includes a connections board configured to receive electrical connections thereon, the connections board having a first connections board side and an oppositely oriented second connections board side, the second connections board side configured to receive and electrically connect to the first interface board side, the first connections board side configured to receive electrical connections thereupon corresponding to the integrated circuit test device.

In another embodiment disclosed herein, a system for testing an integrated circuit device, the system includes a rapid configuration adapter assembly having a test circuit board configured to connect to an integrated circuit test device, an interconnect board having a first interconnect board side and an oppositely oriented second interconnect board side, the first interconnect board side configured to receive and electrically connect to the test circuit board. The test circuit board further includes an interface board configured to connect to external one of a controller, a processor or data collection equipment, the interface board having a first interface board side and an oppositely oriented second interface board side, the second interface board side configured to receive and electrically connect to the first interconnect board side. The test circuit board further includes a connections board configured to receive electrical connections thereon, the connections board having a first connections board side and an oppositely oriented second connections board side, the second connections board side configured to receive and electrically connect to the first interface board side, the first connections board side configured to receive electrical connections thereupon corresponding to the integrated circuit test device. The system for testing an integrated circuit device further includes a test chamber having an aperture therein configured to receive the test circuit board and a Radio Frequency (RF) generator configured to emit RF emissions into the test chamber to thereby impinge upon the test circuit board and any integrated circuit test device configured to be attached thereto.

In another embodiment disclosed herein, a method of testing an integrated circuit device includes providing a rapid configuration adapter assembly for testing integrated circuit including a test circuit board configured to connect to an integrated circuit test device and an interconnect board having a first interconnect board side and an oppositely oriented second interconnect board side, the first interconnect board side configured to receive and electrically connect to the test circuit board. The rapid configuration adapter assembly further includes an interface board configured to connect to external one of a controller, a processor or data collection equipment, the interface board having a first interface board side and an oppositely oriented second interface board side, the second interface board side configured to receive and electrically connect to the first interconnect board side. The rapid configuration adapter assembly further includes a connections board configured to receive electrical connections thereon, the connections board having a first connections board side and an oppositely oriented second connections board side, the second connections board side configured to receive and electrically connect to the first interface board side, the first connections board side configured to receive electrical connections thereupon corresponding to the integrated circuit test device. The method of testing an integrated circuit device further includes connecting an integrated circuit test device to the test circuit board, connecting the test circuit board to the interconnect board, positioning the test circuit board with the integrated circuit test device within an aperture of a test chamber, sealing the aperture of the test chamber with a ground plane interface around peripheral edges of the second interconnect board side, applying environmental parameters to and operational parameters on the integrated circuit test device within the test chamber, and measuring performance characteristics on the integrated circuit test device having the environmental and operational parameters applied thereto via the interface board.

The features, functions, and advantages that have been discussed can be achieved independently in various embodiments of the present disclosure or may be combined in yet other embodiments, further details of which can be seen with reference to the following description and drawings.

BRIEF DESCRIPTION OF THE DRAWINGS

The embodiments presented herein will become more fully understood from the detailed description and the accompanying drawings, wherein:

FIG. 9 illustrates a logic flowchart of a method of testing an integrated circuit device according to one embodiment described herein.

DETAILED DESCRIPTION

The following detailed description is directed to a Rapid Configuration adapter (RCa) purpose is for mounting Integrated Circuits (IC) of standard and non-standard package types and technologies as test articles in GTEM Cell, TEM Cell, RF Bulk Current Injection, and RF Direct Injection test fixtures. The RCa adapter provides microprocessor support and circuit prototype area for design and rapid fabrication of circuits necessary to make IC test articles operational before, during, and after measurements of Transient Voltage and Current, Audio Frequency, and Radio Frequency Immunity and Emissions are conducted on the test article. The embodiment presented herein significantly reduces reliance on costly time consuming regression testing and certification of avionics and card files affected by IC obsolescence and alternative source selection. This test method may be employed across all commercial and military vehicle products. The embodiments presented herein will become more fully understood from the detailed description and the accompanying drawings.

Figure 1:
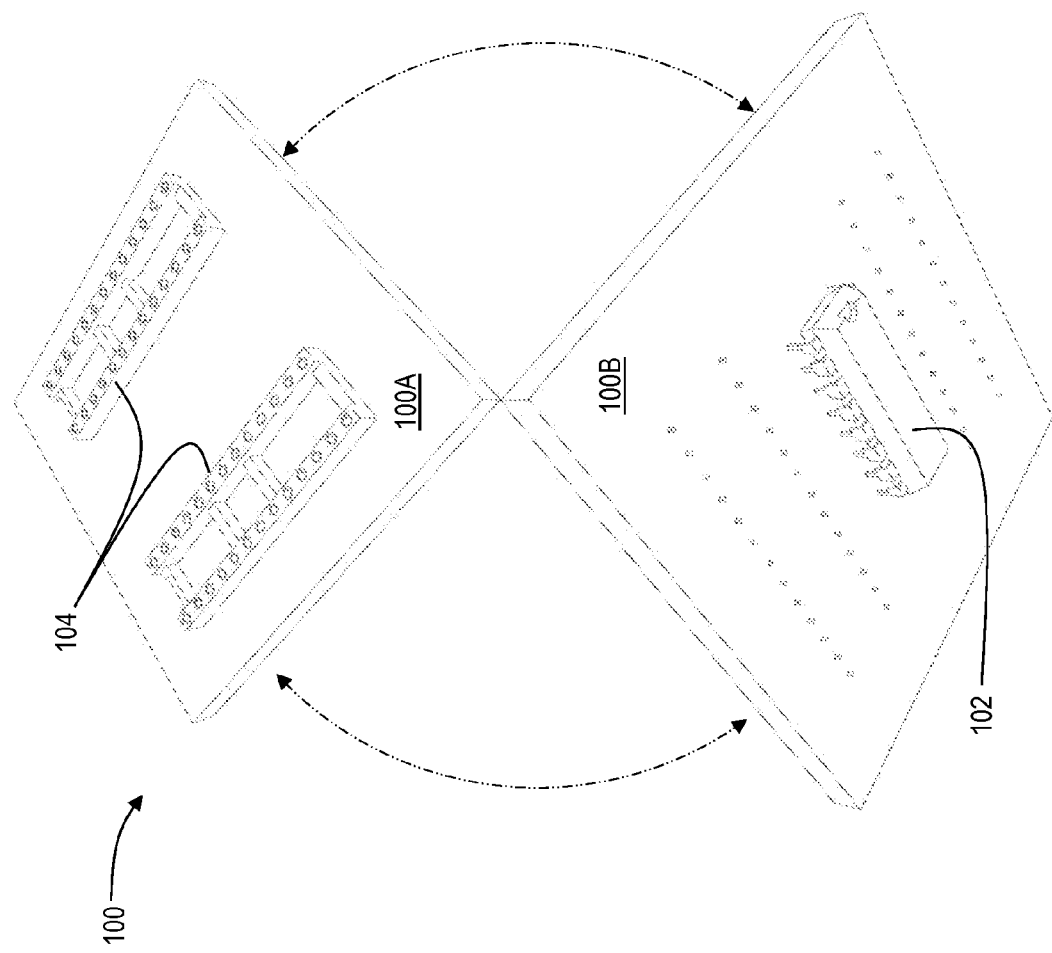
FIG. 1 illustrates a representative test circuit board according to one embodiment described herein.

FIG. 1 illustrates a representative test circuit board 100 having a test circuit board first side 100A and an oppositely disposed test circuit board second side 100B. An integrated test circuit device 102 may be connected to corresponding electrical connections on the test circuit board second side 100B that are electrically connected to a test circuit board interconnect 104. This test circuit board 100 and the test circuit device 102 are directly enclosed within a test chamber, (described later), to measure the characteristics of the test circuit device 102 under different environmental and operating parameters.

Figure 2:
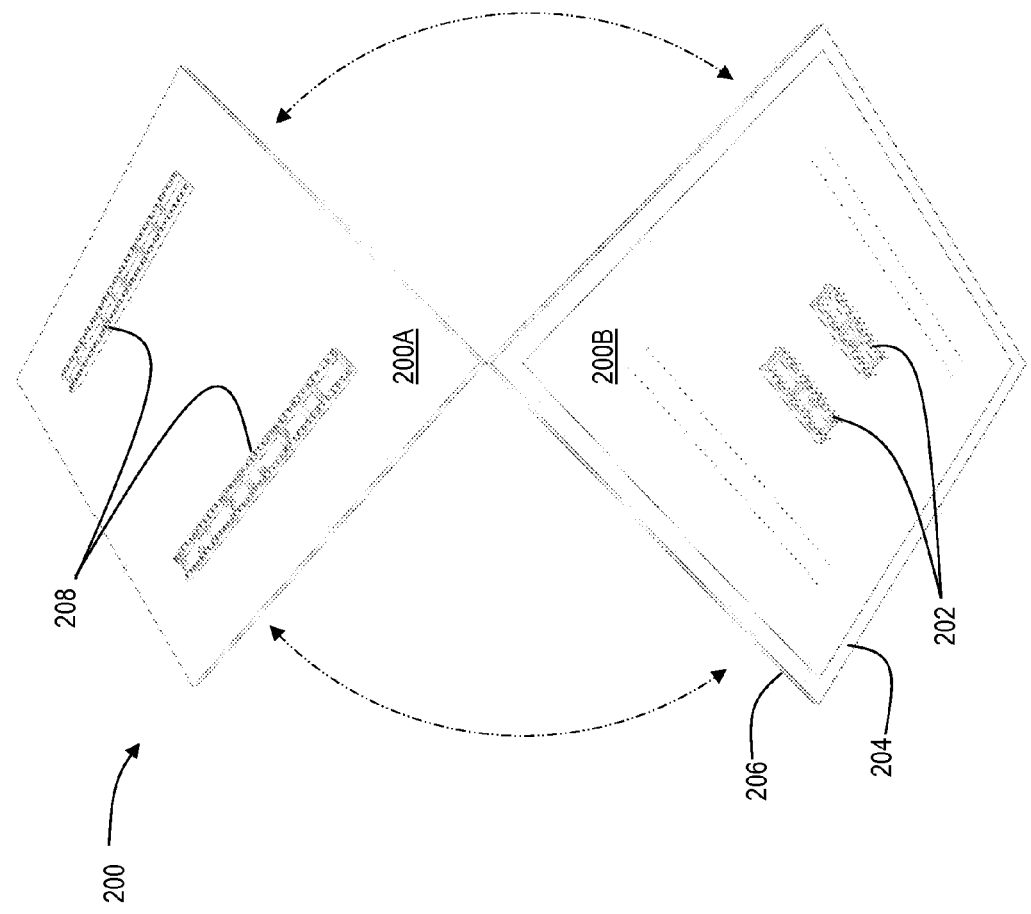
FIG. 2 illustrates a representative interconnect board according to one embodiment described herein.

FIG. 2 illustrates a representative interconnect board 200 having an interconnect board first side 200A and interconnect board second side 200B. The interconnect board second side 200B may include an interconnect board second side interconnect 202 for connection to the test circuit board interconnect 104 on the test circuit board second side 100B. The interconnect board second side 200B further includes an interconnect board ground plane interface 204 around an interconnect board peripheral edge 206. The interconnect board first side 200A may further include an interconnect board first side interconnect 208 that passes electrical signals received at from the interconnect board second side interconnect 202 there-through.

Figure 3:
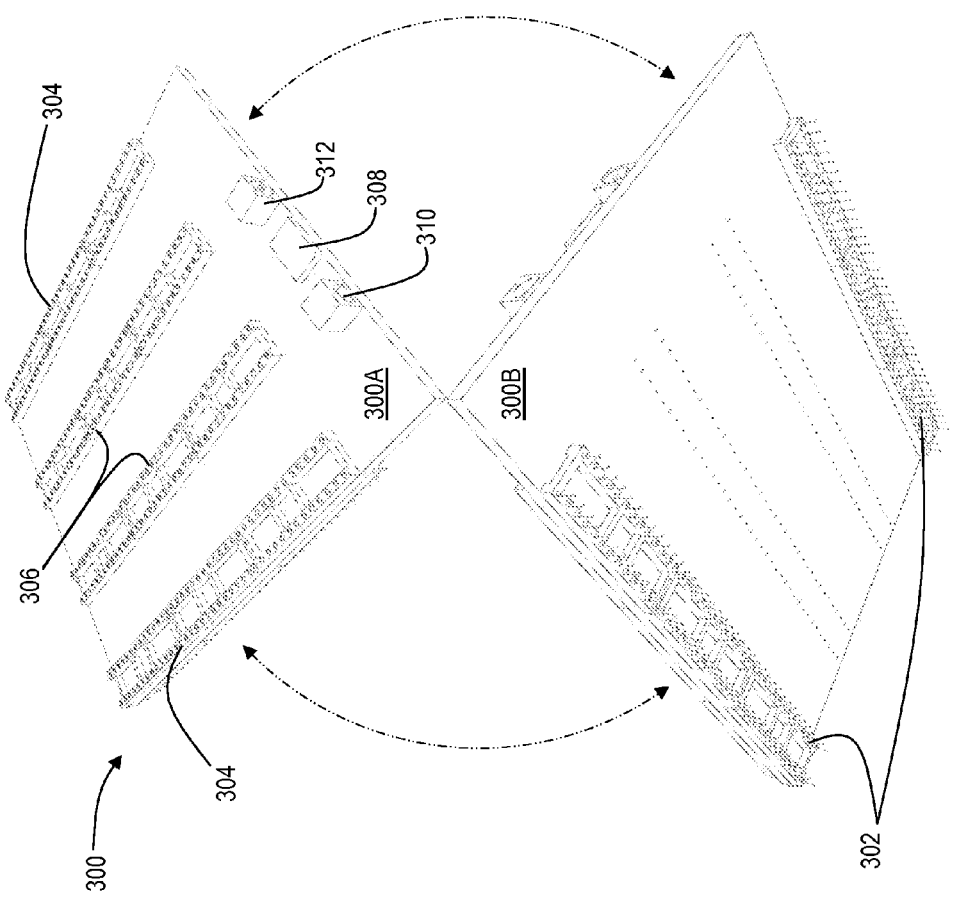
FIG. 3 illustrates a representative interface board according to one embodiment described herein.

FIG. 3 illustrates a representative interface board 300 including an interface board first side 300A and an interface board second side 300B. The interface board second side 300B further may include interface board second side pass-through interconnect 302 that receives electrical signals from the interconnect board first side interconnect 208 on the interconnect board first side 200A. An interface board first side pass-through interconnect 304 passes electrical signals received from the interface board second side pass-through interconnect 302 there-through, as described below. The interface board interface board first side 300A may further include an interface board first side interconnect 306 thereon for receiving signals that pass through the interface board first side pass-through interconnect 304, as described below. The interface board interface board first side 300A may further include an on-board microprocessor controller 308 to process received and/or transmitted signals therein, an interface board data bus interface 310 and an interface board network communication interface 312 for communication with any external processor or external Voltage-Controlled Oscillator (VCO) via a serial or Universal Serial Bus (USB) interface.

Figure 4:
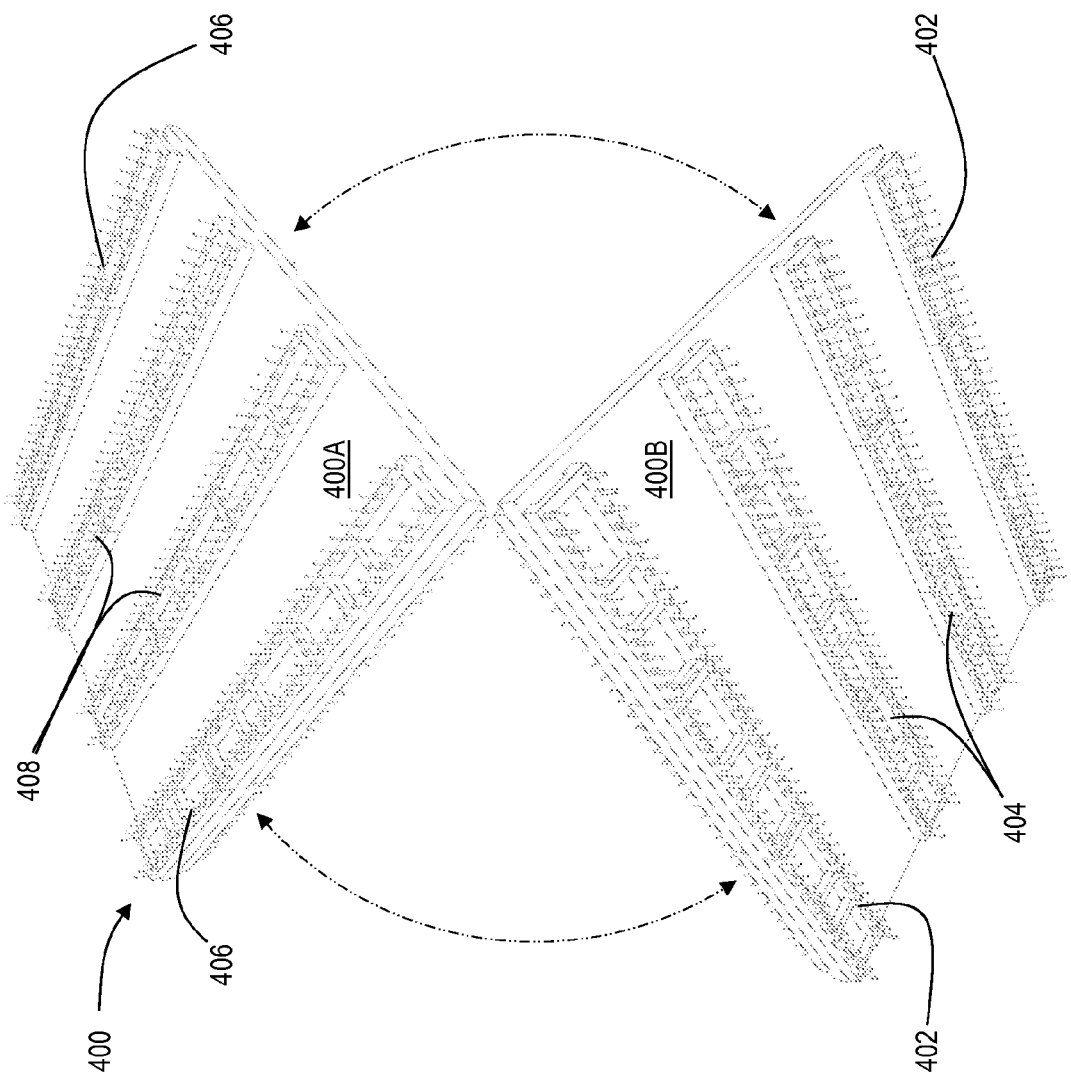
FIG. 4 illustrates a representative connections board according to one embodiment described herein.

FIG. 4 illustrates a representative connections board 400 connections board having a connections board first side 400A and a connections board second side 400B. The connections board second side 400B further includes a connections board second side pass-through interconnect 402 for receiving electrical signals from the interface board first side pass-through interconnect 304 on the interface board interface board first side 300A. The connections board first side pass-through interconnect 406 passes electrical signals from the connections board second side pass-through interconnect 402 there-through. Electrical connections may be made between the a connections board first side interconnect 408 on the connections board first side 400A and the connections board first side pass-through interconnect 406 in such a manner that a user may configure these electrical connections appropriate for each integrated circuit test device 102 on the test circuit board 100. The electrical signals received at the connections board first side interconnect 408 are routed to the connections board second side interconnect 404 for connection to the interface board first side interconnect 306 on the interface board interface board first side 300A.

Figure 5:
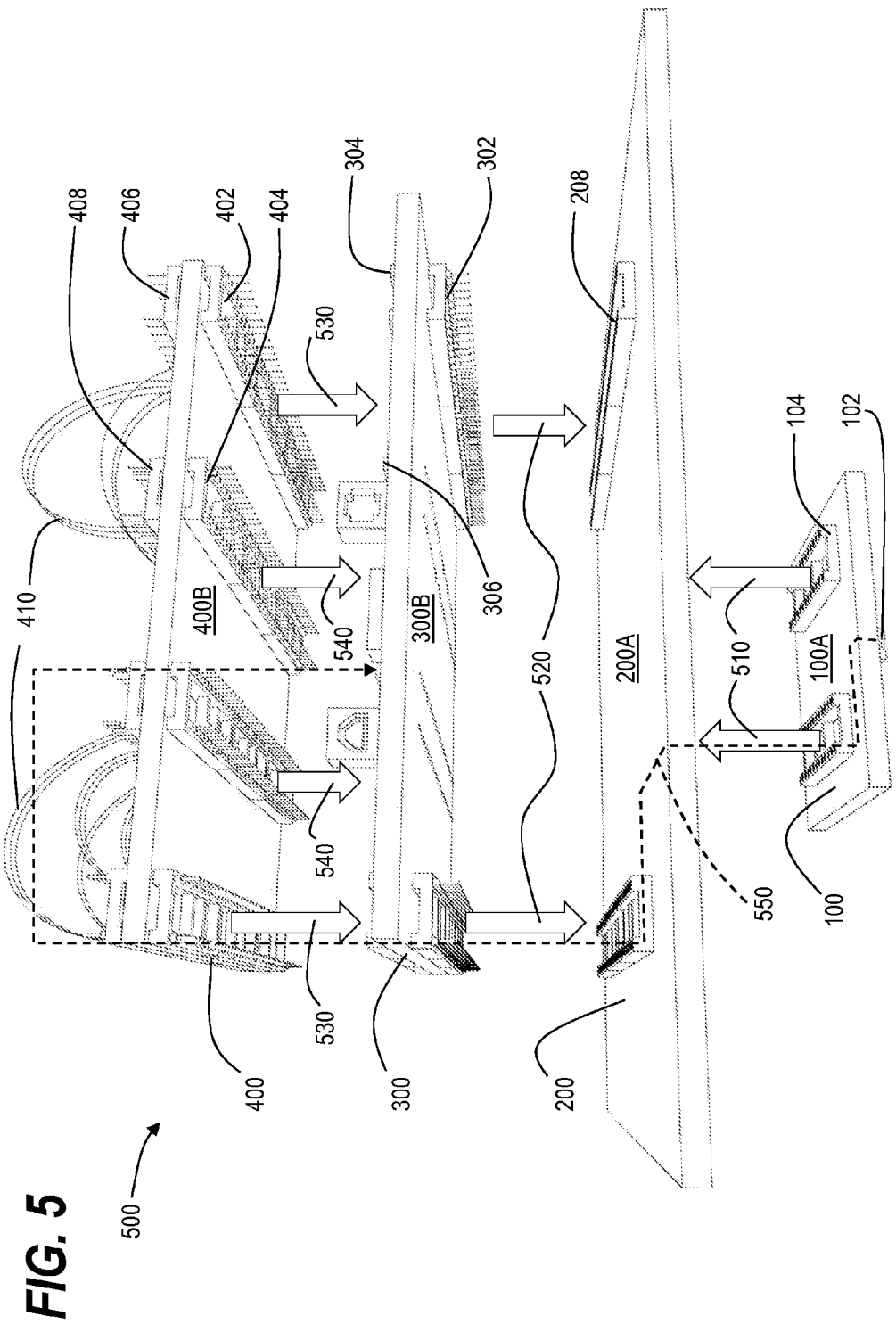
FIG. 5 illustrates a rapid configuration adapter exploded assembly view according to one embodiment described herein.

FIG. 5 illustrates a rapid configuration adapter exploded assembly view 500 where the test circuit board 100 including the integrated test circuit device 102 may be connected to the interconnect board in a connection direction 510 between test circuit board first side 100A and interconnect board second side 200B by joining the test circuit board interconnect 104 with the interconnect board second side interconnect 202. The interconnect board 200 may be connected to the interface board 300 in a connection direction 520 between interface board second side 300B and interconnect board first side 200A by joining the interconnect board first side interconnect 208 with the interface board second side pass-through interconnect 302.

The interface board may be connected to the connections board 400 in a connection direction 530 between the connections board second side pass-through interconnect 402 of connections board second side 400B and the interface board first side pass-through interconnect 304 of interface board first side 300A, and further in a connection direction 540 between connections board second side interconnect 404 of connections board second side 400B and the interface board first side interconnect 306 of interface board first side 300A.

An electrical signal path 550 is illustrated representing a schematic diagram of a communication path between the integrated circuit device 102 to the interface board first side interconnect 306. Starting with the integrated circuit device 102, the electrical signal path 550 proceeds from the test circuit board second side 100B to the test circuit board first side 100A; the path 550 then proceeds through the test circuit board interconnect 104 and into the interconnect board second side interconnect 202 on the interconnect board second side 200B; the path 550 then proceeds through the interconnect board first side interconnect 208 on the interconnect board first side 200A to the interface board second side pass-through interconnect 302 on the interface board second side 300B; the path 550 then proceeds through the interface board first side pass-through interconnect 304 on the interface board first side 300A to the connections board second side pass-through interconnect 402 on the connections board second side 400A; the path 550 then proceeds through the connections board first side pass-through interconnect 406 through jumper wire connections 410 that connect via a user's configuration to the connections board first side interconnect 408 on the connections board first side 400A; the path 550 then proceeds through the connections board second side interconnect 404 on the connections board second side 400B to the interface board first side interconnect 306 on the interface board first side 300A. The signals may then be processed by the on-board microprocessor controller 308 and output via various output protocols and connections, e.g., the interface board data bus interface 310 and/or the interface board network communication interface 312.

Figure 6:
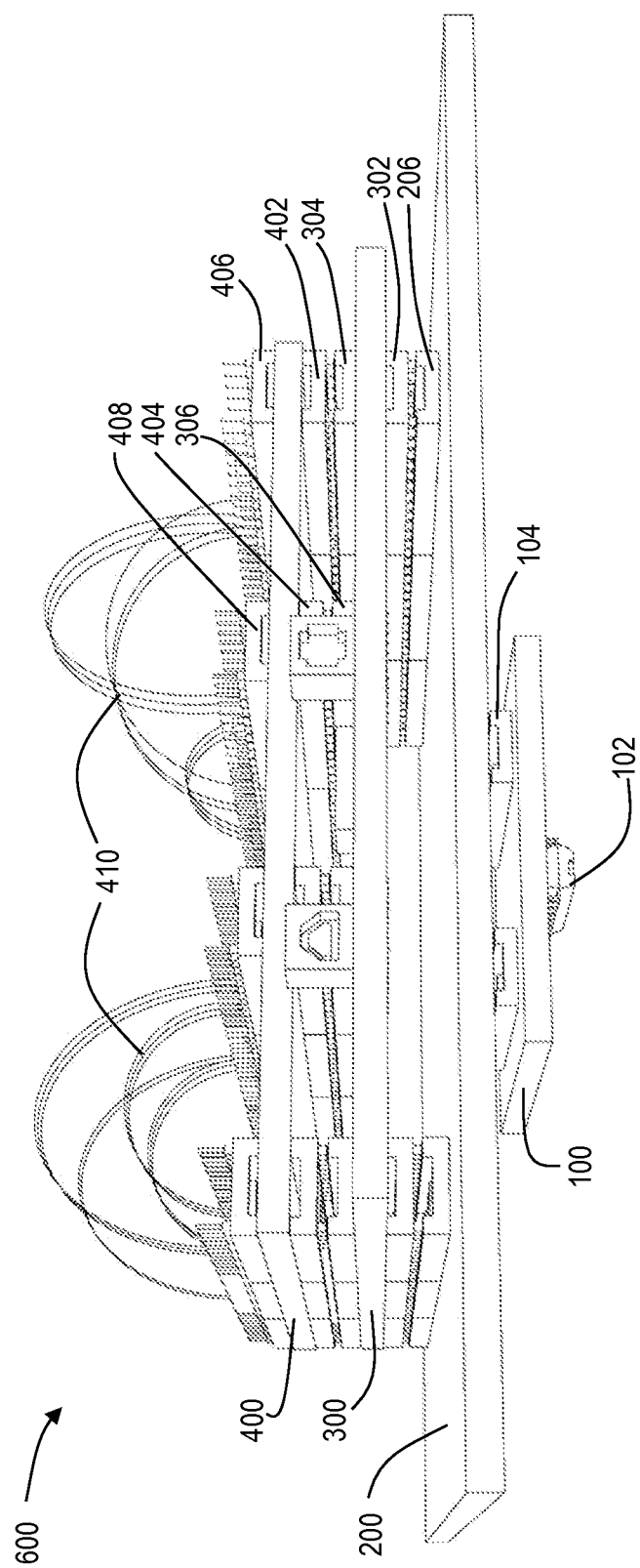
FIG. 6 illustrates a rapid configuration adapter assembly view according to one embodiment described herein.

FIG. 6 illustrates a rapid configuration adapter assembly view 600 including the test circuit board 100 with the integrated test circuit device 102 connected to the interconnect board 200, connected to the interface board 300, connected to the connections board 400 having jumper wire connections 410 that route the signals between the on-board microprocessor controller 308, the interface board data bus interface 310 and/or the interface board network communication interface 312 and the integrated test circuit device 102 on the test circuit board 100.

Figure 7:
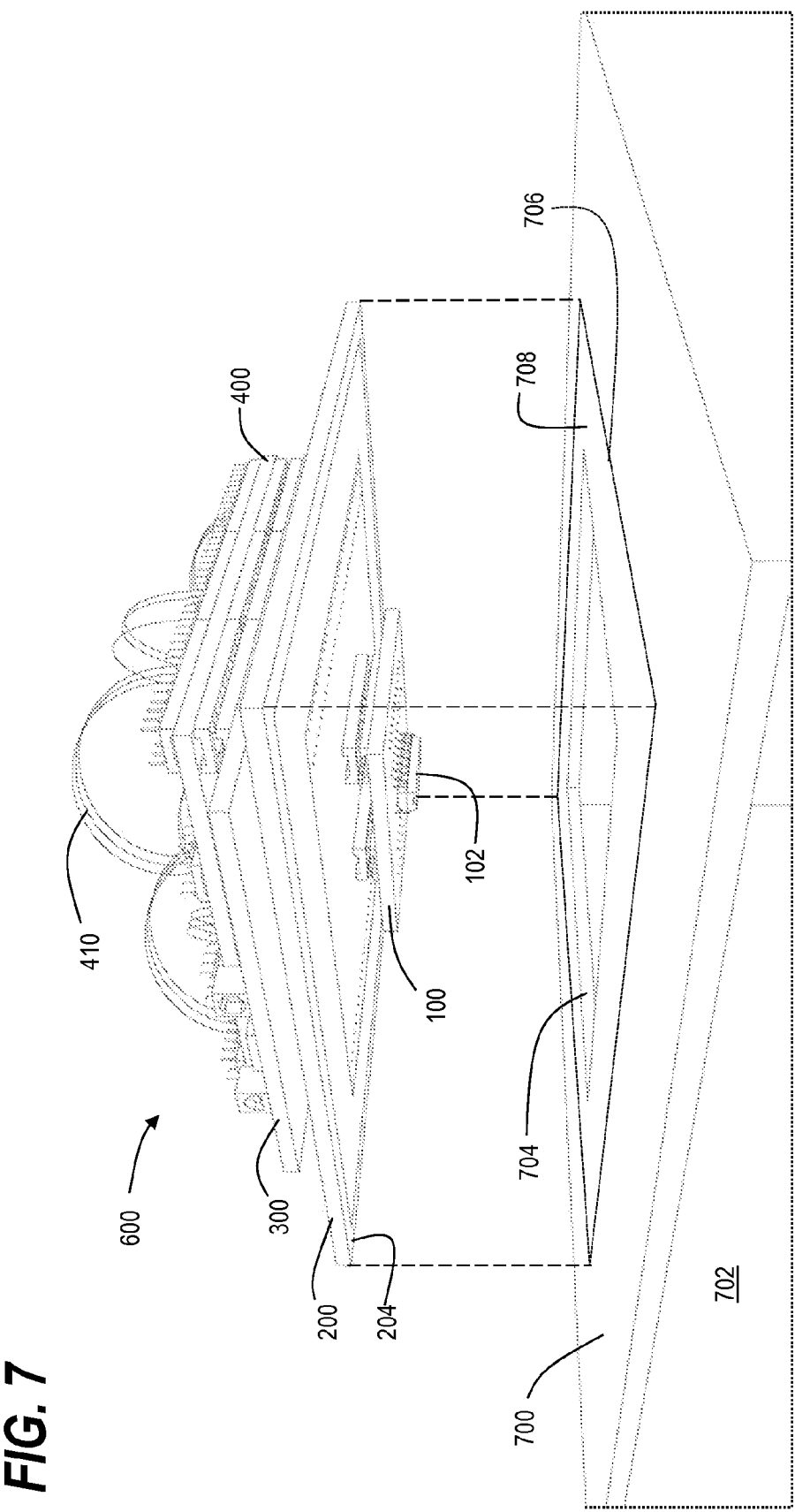
FIG. 7 illustrates a rapid configuration adapter assembly aligned for connection to a test chamber according to one embodiment described herein.

FIG. 7 illustrates a rapid configuration adapter assembly 600 aligned for connection to a test chamber 700. (The following illustrations represent a test chamber cut-out 702 to illustrate the interior portion of the test chamber 700.) The test chamber 700 further includes an integrated circuit test device chamber aperture 704 for receiving the integrated circuit test device 102 mounted to the test circuit board 100 therein. The interconnect board 200 provides a peripheral overlapping footprint 706 on an exterior portion of the test chamber 700 adjacent the integrated circuit test device chamber aperture 704. This overlapping footprint 706 defines an area of a ground plane contact 708 of test chamber 700 with the interconnect board ground plane interface 204. When the interconnect board ground plane interface 204 contacts the area of a ground plane contact 708 on the chamber 700, the integrated circuit test device chamber aperture 704 of the test chamber 700 is electrically sealed thereby preventing Radio Frequency (RF) signals within the test chamber 700 from escaping through the integrated circuit test device chamber aperture 704. The interconnect board second side 200B may additionally include electrical shielding covering a substantial portion thereof to prevent any RF signals from penetrating through the interconnect board 200.

Figure 8:
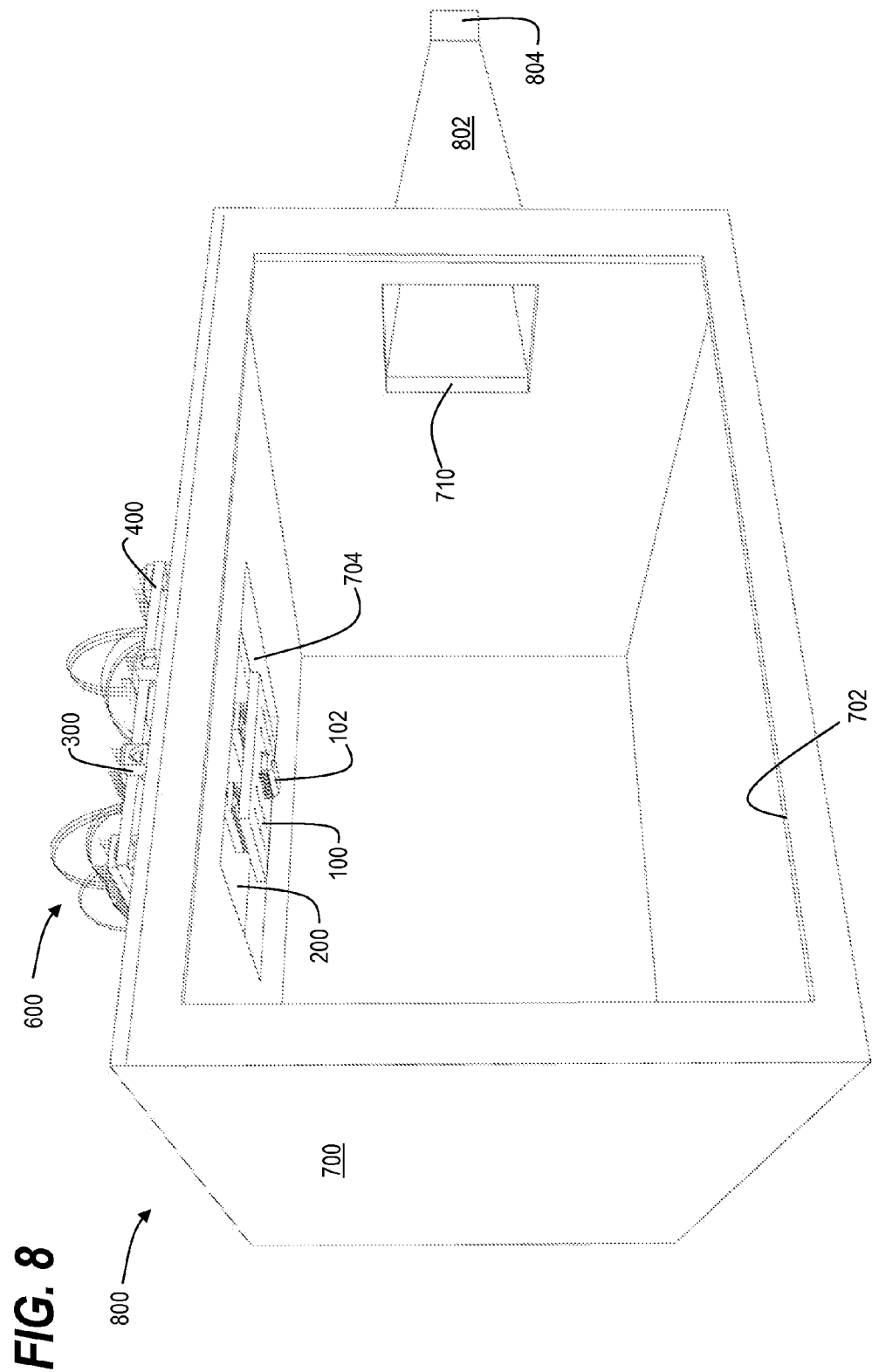
FIG. 8 illustrates a rapid configuration adapter used on a test system according to one embodiment described herein.

FIG. 8 illustrates test assembly system 800 including the rapid configuration adapter 600 used in a test system further including an RF horn 802 and RF generator/driver 804 for transmitting RF signals into the test chamber 700 through an RF horn aperture 710.

FIG. 9 illustrates a logic flowchart of a method of testing an integrated circuit device including providing 900 a rapid configuration adapter assembly for testing an integrated circuit 102 that includes a test circuit board 100 configured to connect to an integrated circuit test device 102 and an interconnect board 200 having a first interconnect board side 200A and an oppositely oriented second interconnect board side 200B, the first interconnect board side 200A configured to receive and electrically connect to the test circuit board 100. The a rapid configuration adapter assembly further includes an interface board 300 configured to connect to external one of a controller, a processor or data collection equipment, the interface board 300 having a first interface board side 300A and an oppositely oriented second interface board side 300B, the second interface board side 300B configured to receive and electrically connect to the first interconnect board side 200A. The a rapid configuration adapter assembly further includes a connections board 400 configured to receive electrical connections thereon, the connections board having a first connections board side 400A and an oppositely oriented second connections board side 400B, the first connections board side 400A configured to receive and electrically connect to the first interface board side 300A, the first connections board side 400A configured to the receive electrical connections thereupon corresponding to the integrated circuit test device 102.

The method of testing an integrated circuit device further includes connecting 902 an integrated circuit test device 102 to the test circuit board 100, and connecting 904 the test circuit board 100 to the interconnect board 200. The test circuit board 100 then proceeds to be positioned 906 with the integrated circuit test device 102 within an aperture 704 of a test chamber 700, thereby sealing 908 the aperture 704 of the test chamber 700 with a ground plane interface 204 around peripheral edges 206 of the second interconnect board side 200B.

The method of testing an integrated circuit device further includes applying 910 environmental parameters to and operational parameters on the integrated circuit test device 102 within the test chamber 700, and subsequently measuring 912 performance characteristics on the integrated circuit test device 102 having the environmental and operational parameters applied thereto via the interface board 300.

The method of testing an integrated circuit device may further include providing electrical connections 410 to the connections board 400 that route signals from the integrated circuit test device 102 to the interface board 300.

The method of testing an integrated circuit device may further include changing the integrated circuit test device 102 from the test circuit board 100 with a second integrated circuit test device (102b, not shown) before applying the environmental parameters to and operational parameters on the second integrated circuit test (102b) device within the test chamber 700. The connections board 400 may be replaced with a second connections board (400b, not shown) configured for the second integrated circuit test device (102b). Thereafter, environmental parameters to and operational parameters on the second integrated circuit test device (102b) may be applied within the test chamber 700, and performance characteristics may be measured on the integrated second circuit test device (102b) having the environmental and operational parameters applied thereto via the interface board 300.

The method of testing an integrated circuit device may further include environmental parameters applied to the integrated circuit test device 102 that comprise at least one of a Gigahertz Transverse Electro-Magnetic (GTEM), a Transverse Electro-Magnetic (TEM), a Radio Frequency (RF) Bulk Current, an electro-magnetic field, or RF Direct Injection.

In summary, a system for testing an integrated circuit device 102 is presented herein where the system may include a rapid configuration adapter assembly 600, a test chamber 700 having an aperture 704 therein configured to receive the test circuit board 100, and a Radio Frequency (RF) generator 802/804 configured to emit RF emissions into the test chamber 700 to thereby impinge upon the test circuit board 100 and any integrated circuit test device 102 configured to be attached thereto.

The rapid configuration adapter assembly 600 may include a test circuit board 100 configured to connect to an integrated circuit test device 102, and an interconnect board 200 having a first interconnect board side 200A and an oppositely oriented second interconnect board side 200B, the second interconnect board side 200B configured to receive and electrically connect to the test circuit board 100.

The rapid configuration adapter assembly may further include an interface board 300 configured to connect to external one of a controller, a processor or data collection equipment, the interface board 300 having a first interface board side 300A and an oppositely oriented second interface board side 300B, the second interface board side 300B configured to receive and electrically connect to the first interconnect board side 200A. The rapid configuration adapter assembly 600 may further include a connections board 400 configured to receive electrical connections thereon, the connections board 400 having a first connections board side 400A and an oppositely oriented second connections board side 400B, the second connections board side 400B configured to receive and electrically connect to the first interface board side 300A, and where the first connections board side 400A additionally may be configured to receive electrical connections 410 thereupon corresponding to the integrated circuit test device 102.

The test circuit board 100 includes a first test circuit board side including electrical connections, and an oppositely oriented second test circuit board side 100A configured to receive the integrated circuit test device. The first interconnect board 200 further includes a ground plane interface 204 around peripheral edges 206 of the second interconnect board side 200B. The ground plane interface 204 being configured to substantially provide a protective ground path around an aperture 704 of a test chamber 700. The second interconnect board side 200B of the interconnect board 200 includes conductive shielding therewith, the conductive shielding configured to substantively prevent radio frequency (RF) emissions from passing through the second interconnect board side 200B.

The interface board 300 further may include at least one on-board microprocessor 308, pass-through electrical connectors 302/304 configured to route signals from the interconnect board directly to the connections board 400, and interface board electrical connectors 306 on the first interface board side 300A, the interface board electrical connectors 306 configured to receive electrical connections from the connections board 400.

The connections 400 board further includes pass-through electrical connectors 402/406 configured to receive signals from the interface board 300, where the pass-through electrical connectors are on both the first 400A and second 400B connections board sides. The connections board 400 further includes interface electrical connectors 404/408 configured to transmit signals from the pass-through electrical connectors 402/406 to the interface board 300.

The system for testing an integrated circuit device may further include electrical jumper connections 410 on the first connections board side 400A, where the electrical jumper connections 410 correspond to a corresponding integrated circuit device 102 attached to the second test circuit board side 100B.

The subject matter described above is provided by way of illustration only and should not be construed as limiting. Various modifications and changes may be made to the subject matter described herein without following the example embodiments and applications illustrated and described, and without departing from the true spirit and scope of the present disclosure, which is set forth in the following claims.

The invention claimed is:

1. A rapid configuration adapter assembly comprising:
   a test circuit board configured to connect to an integrated circuit test device;
   an interconnect board having a first interconnect board side and an oppositely oriented second interconnect board side, the first interconnect board side configured to receive and electrically connect to the test circuit board;
   an interface board configured to connect to external one of a controller, a processor or data collection equipment, the interface board having a first interface board side and an oppositely oriented second interface board side, the second interface board side configured to receive and electrically connect to the first interconnect board side; and
   a connections board configured to receive electrical connections thereon, the connections board having a first connections board side and an oppositely oriented second connections board side, the second connections board side configured to receive and electrically connect to the first interface board side, the first connections board side configured to receive electrical connections thereupon corresponding to the integrated circuit test device.

2. The rapid configuration adapter according to claim 1, wherein the test circuit board includes a first test circuit board side configured to receive the integrated circuit test device, and an oppositely oriented second test circuit board side including electrical connections.

3. The rapid configuration adapter according to claim 2, further comprising electrical jumper connections on the second connections board side, where the electrical jumper connections correspond to the corresponding integrated circuit device attached to the first test circuit board side.

4. The rapid configuration adapter according to claim 1, wherein the first interconnect board further includes a ground plane interface around peripheral edges of the first interconnect board side,
   wherein the ground plane interface being configured to substantially provide a protective ground path around an aperture of a test chamber.

5. The rapid configuration adapter according to claim 1, wherein the first interconnect board side of the interconnect board includes conductive shielding therewith, the conductive shielding configured to substantively prevent Radio Frequency (RF) emissions from passing through the first interconnect board side.

6. The rapid configuration adapter according to claim 1, wherein the interface board further comprises:
   at least one on-board processor;

pass-through electrical connectors configured to route signals from the interconnect board directly to the connections board; and interface board electrical connectors on the second interface board side, the interface board electrical connectors configured to receive electrical connections from the connections board.

7. The rapid configuration adapter according to claim 1, wherein the connections board further comprises:
pass-through electrical connectors configured to receive signals from the interface board, where the pass-through electrical connectors are on both the first and second connections board sides; and
interface electrical connectors configured to transmit signals from the pass-through electrical connectors to the interface board.

8. An integrated test circuit system comprising:
a rapid configuration adapter assembly including
a test circuit board configured to connect to an integrated circuit test device,
an interconnect board having a first interconnect board side and an oppositely oriented second interconnect board side, the first interconnect board side configured to receive and electrically connect to the test circuit board,
an interface board configured to connect to external one of a controller, a processor or data collection equipment, the interface board having a first interface board side and an oppositely oriented second interface board side, the second interface board side configured to receive and electrically connect to the first interconnect board side, and
a connections board configured to receive electrical connections thereon, the connections board having a first connections board side and an oppositely oriented second connections board side, the second connections board side configured to receive and electrically connect to the first interface board side, the first connections board side configured to receive electrical connections thereupon corresponding to the integrated circuit test device;
a test chamber having an aperture therein configured to receive the test circuit board; and
a Radio Frequency (RF) generator configured to emit RF emissions into the test chamber to thereby impinge upon the test circuit board and any integrated circuit test device configured to be attached thereto.

9. The integrated test circuit system according to claim 8, wherein the test circuit board includes a first test circuit board side including electrical connections, and an oppositely oriented second test circuit board side configured to receive the integrated circuit test device.

10. The integrated test circuit system according to claim 9, further comprising electrical jumper connections on the first connections board side, where the electrical jumper connections correspond to a corresponding integrated circuit device attached to the second test circuit board side.

11. The integrated test circuit system according to claim 8, wherein the first interconnect board further includes a ground plane interface around peripheral edges of the second interconnect board side,
wherein the ground plane interface being configured to substantively provide a protective ground path around an aperture of a test chamber.

12. The integrated test circuit system according to claim 8, wherein the first interconnect board side of the interconnect board includes conductive shielding therewith, the conductive shielding configured to substantively prevent radio frequency (RF) emissions from passing through the first interconnect board side.

13. The integrated test circuit system according to claim 8, wherein the interface board further comprises:
at least one on-board microprocessor;
pass-through electrical connectors configured to route signals from the interconnect board directly to the connections board; and
interface board electrical connectors on the first interface board side, the interface board electrical connectors configured to receive electrical connections from the connections board.

14. The integrated test circuit system according to claim 8, wherein the connections board further comprises:
pass-through electrical connectors configured to receive signals from the interface board, where the pass-through electrical connectors are on both the first and second connections board sides; and
interface electrical connectors configured to transmit signals from the pass-through electrical connectors to the interface board.

15. An integrated circuit test method comprising:
providing a rapid configuration adapter assembly for testing an integrated circuit including
a test circuit board configured to connect to an integrated circuit test device,
an interconnect board having a first interconnect board side and an oppositely oriented second interconnect board side, the first interconnect board side configured to receive and electrically connect to the test circuit board,
an interface board configured to connect to external one of a controller, a processor or data collection equipment, the interface board having a first interface board side and an oppositely oriented second interface board side, the second interface board side configured to receive and electrically connect to the first interconnect board side, and
a connections board configured to receive electrical connections thereon, the connections board having a first connections board side and an oppositely oriented second connections board side, the second connections board side configured to receive and electrically connect to the first interface board side, the first connections board side configured to receive electrical connections thereupon corresponding to the integrated circuit test device;
connecting an integrated circuit test device to the test circuit board;
connecting the test circuit board to the interconnect board;
positioning the test circuit board with the integrated circuit test device within an aperture of a test chamber;
sealing the aperture of the test chamber with a ground plane interface around peripheral edges of the second interconnect board side;
applying environmental parameters to and operational parameters on the integrated circuit test device within the test chamber; and
measuring performance characteristics on the integrated circuit test device having the environmental and operational parameters applied thereto via the interface board.

16. The integrated circuit test method according to claim 15, further comprises providing electrical connections to the connections board that route signals from the integrated circuit test device to the interface board.

17. The integrated circuit test method according to claim 15, further comprises changing the integrated circuit test device from the test circuit board with a second integrated circuit test device before applying the environmental parameters to and operational parameters on the second integrated circuit test device within the test chamber.

18. The integrated circuit test method according to claim 17, further comprises replacing the connections board with a second connections board configured for the second integrated circuit test device.

19. The integrated circuit test method according to claim 18, further comprises:
   applying environmental parameters to and operational parameters on the second integrated circuit test device within the test chamber; and
   measuring performance characteristics on the second integrated circuit test device having the environmental and operational parameters applied thereto via the interface board.

20. The integrated circuit test method device according to claim 15, wherein environmental parameters applied to the integrated circuit test device comprise at least one of a Gigahertz Transverse Electro-Magnetic (GTEM), a Transverse Electro-Magnetic (TEM), a Radio Frequency (RF) Bulk Current, an electro-magnetic field, or RF Direct Injection.

* * * * *